(12) United States Patent
Chang

(10) Patent No.: US 6,865,078 B1
(45) Date of Patent: Mar. 8, 2005

(54) SERVER RADIATOR

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/684,435

(22) Filed: Oct. 15, 2003

(51) Int. Cl.⁷ ............................................ H05K 7/20
(52) U.S. Cl. .................... 361/695; 361/690; 415/231.1; 454/184
(58) Field of Search ................................ 361/687–690, 361/694, 695; 174/16.1, 16.3; 165/80.2, 80.3, 104.33, 122; 454/184; 415/231.1

(56) References Cited

U.S. PATENT DOCUMENTS

| | | | | |
|---|---|---|---|---|
| 5,995,364 | A | * 11/1999 | McAnally et al. | 361/685 |
| 6,040,981 | A | * 3/2000 | Schmitt et al. | 361/695 |
| 6,075,698 | A | * 6/2000 | Hogan et al. | 361/695 |
| 6,236,564 | B1 | * 5/2001 | Fan | 361/695 |
| 6,349,031 | B1 | * 2/2002 | Lin et al. | 361/685 |
| 6,375,440 | B2 | * 4/2002 | Kosugi | 417/423.14 |
| 6,556,437 | B1 | * 4/2003 | Hardin | 361/687 |
| 6,587,342 | B1 | * 7/2003 | Hsu | 361/695 |
| 6,663,416 | B2 | * 12/2003 | Huang et al. | 439/485 |
| 6,674,641 | B2 | * 1/2004 | Jensen et al. | 361/687 |
| 6,808,411 | B2 | * 10/2004 | Chen | 439/485 |
| 6,817,939 | B2 | * 11/2004 | Gan et al. | 454/184 |

* cited by examiner

Primary Examiner—Boris Chérvinsky
(74) Attorney, Agent, or Firm—Rabin & Berdo, P.C.

(57) ABSTRACT

A server radiator includes a radiator fan, a frame and a case. The frame holds the radiator fan and has a latch element. The case has a housing compartment, which has an opening directed toward and exposed outside the case, and an exposed opening corresponding to the latch element. The frame may be inserted in the housing compartment from outside of the case, and the latch element may be engaged with the exposed opening. The latch element also may be moved away from the exposed opening to allow the frame to be removed from the housing compartment, thereby accomplishing maintenance without opening the case and saving replacement time.

9 Claims, 7 Drawing Sheets

SERVER RADIATOR

FIELD OF THE INVENTION

The invention relates to a server radiator, and particularly to a radiator that is accessible and retrievable for repairs and maintenance without needing to open the server case.

BACKGROUND OF THE INVENTION

There is a growing demand for non-stop and uninterrupted operation on servers. Hence these days most servers are designed with hot-plug capability. Such a design allows malfunctioning or damaged facilities to be replaced immediately. System maintenance people can replace or insert the hot-plug equipment while the application programs are still running without shutting down or re-starting the machine.

Furthermore, the hot-plug equipment also has a fastening structure for coupling with the server. The most commonly adopted approach is fastening the hot-plug equipment to the server with screws with hand tools. However, such an approach makes fast insertion or replacement of the hot-plug equipment impossible. Maintenance tasks are therefore cumbersome.

A fan is the most commonly used hot-plug item. A kind of hot-plug fan has a plastic hook to couple with the fan. The fan mounted in a server may be replaced without using hand tools. Or, the fan may be inserted in a housing compartment and anchored on the server. However, the upper lid of the server has to be opened to perform maintenance tasks. As a result, additional difficulties occur to the maintenance task.

SUMMARY OF THE INVENTION

The primary object of the invention is to provide a server radiator that is accessible and retrievable for repairs and maintenance without opening the server case to save replacement time.

The server radiator of the invention includes a radiator fan, a frame and a case. The radiator fan aims to discharge heat energy from the interior of the server so that the server can maintain normal operation. The frame is for housing the radiator fan and includes a trough and a latch element located in the trough. The latch element includes an elastic slice, which has one end fastened to the frame and another end suspended from the surface of the frame.

The case has a housing compartment to hold the frame. The housing compartment has an opening directed outwards and exposed outside the case, and an exposed opening exposed outside the case corresponding to the latch element.

Thus the invention may be directly inserted into the housing compartment of the frame from outside the case. The latch element may be latched on the exposed opening to anchor the frame in the housing compartment. When the latch element is moved away from the exposed opening, the latch element is held in the trough to enable the frame to be removed from the housing compartment.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
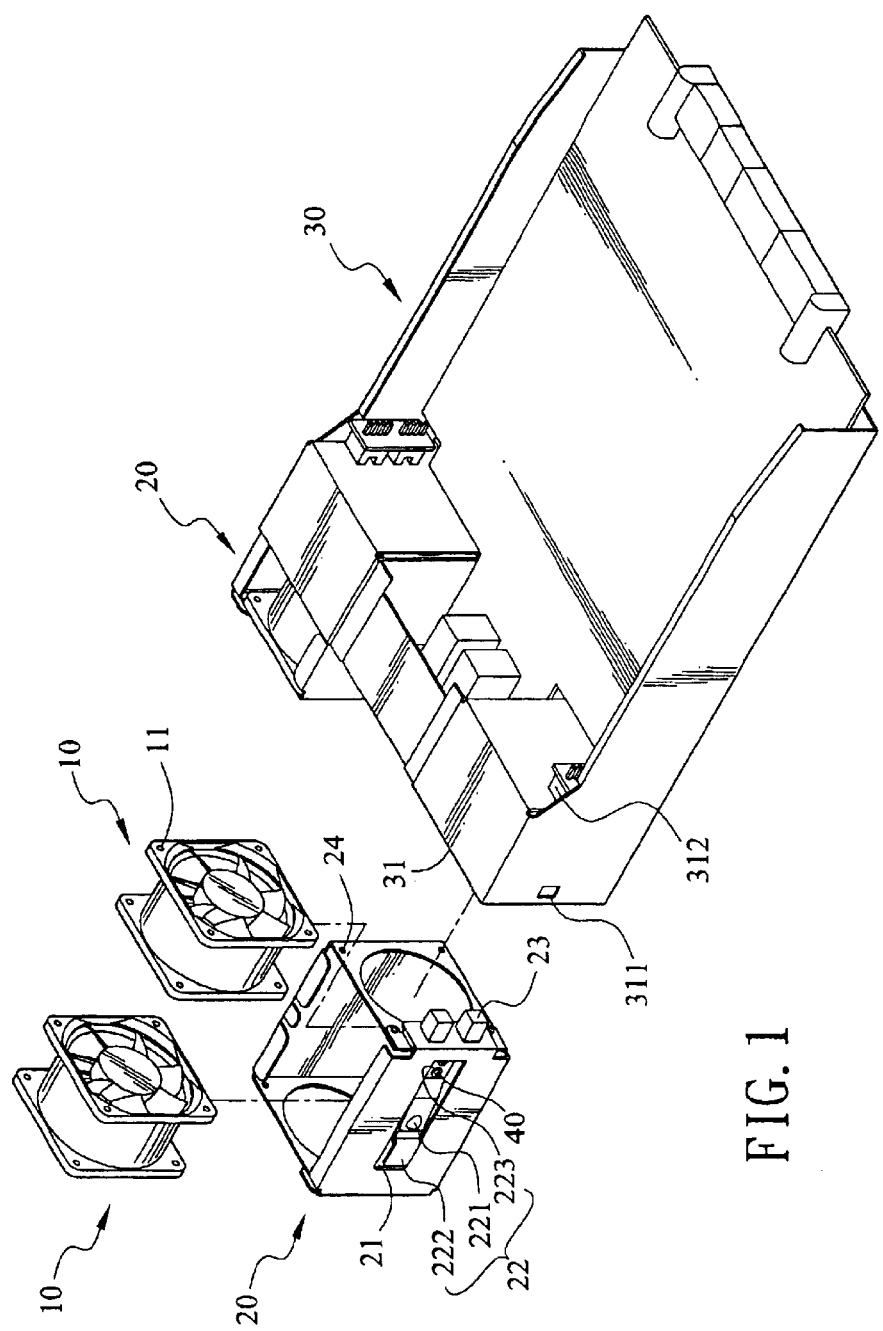
FIG. 1 is an exploded view of a first embodiment of the invention.
Figure 2:
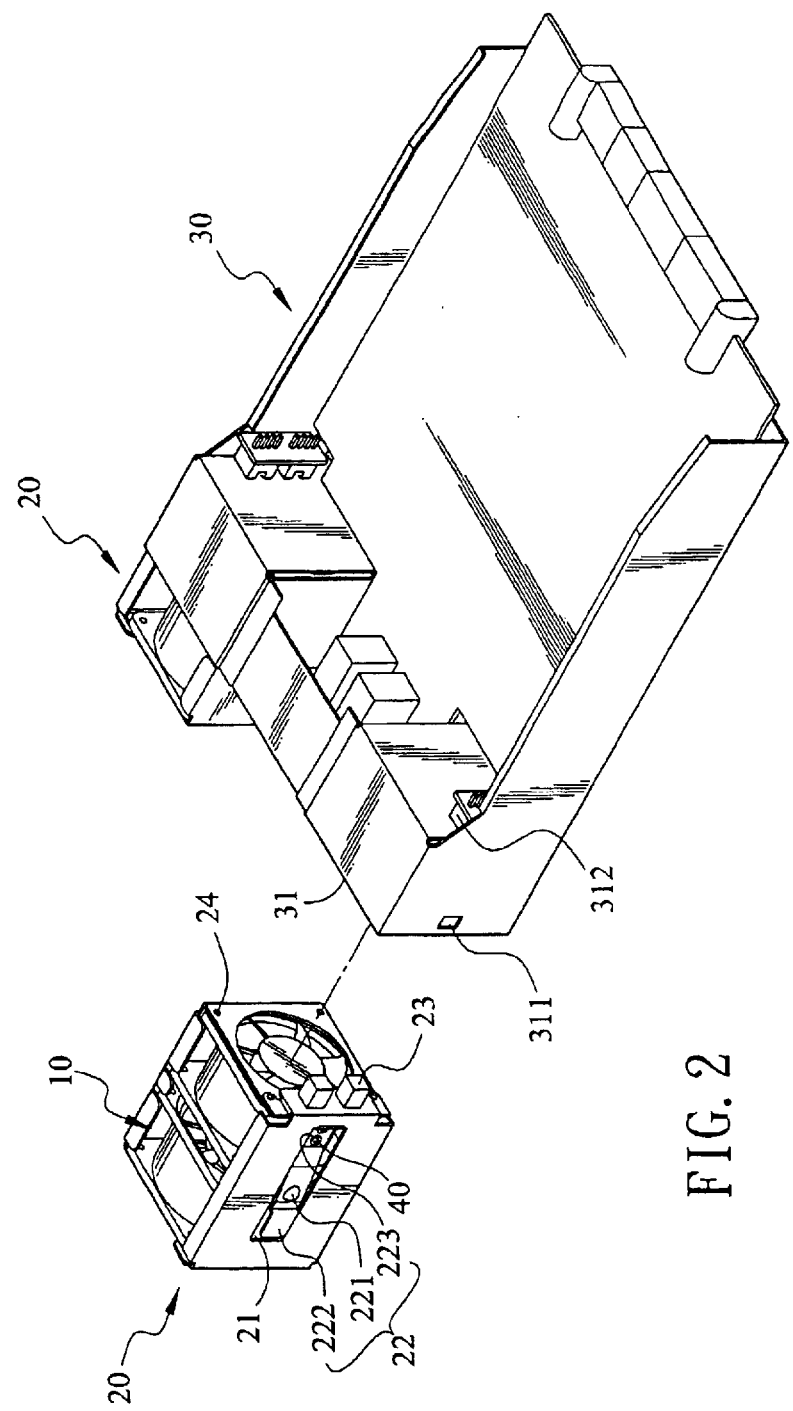
FIG. 2 is a perspective view of the first embodiment of the invention, partly assembled.
Figure 3:
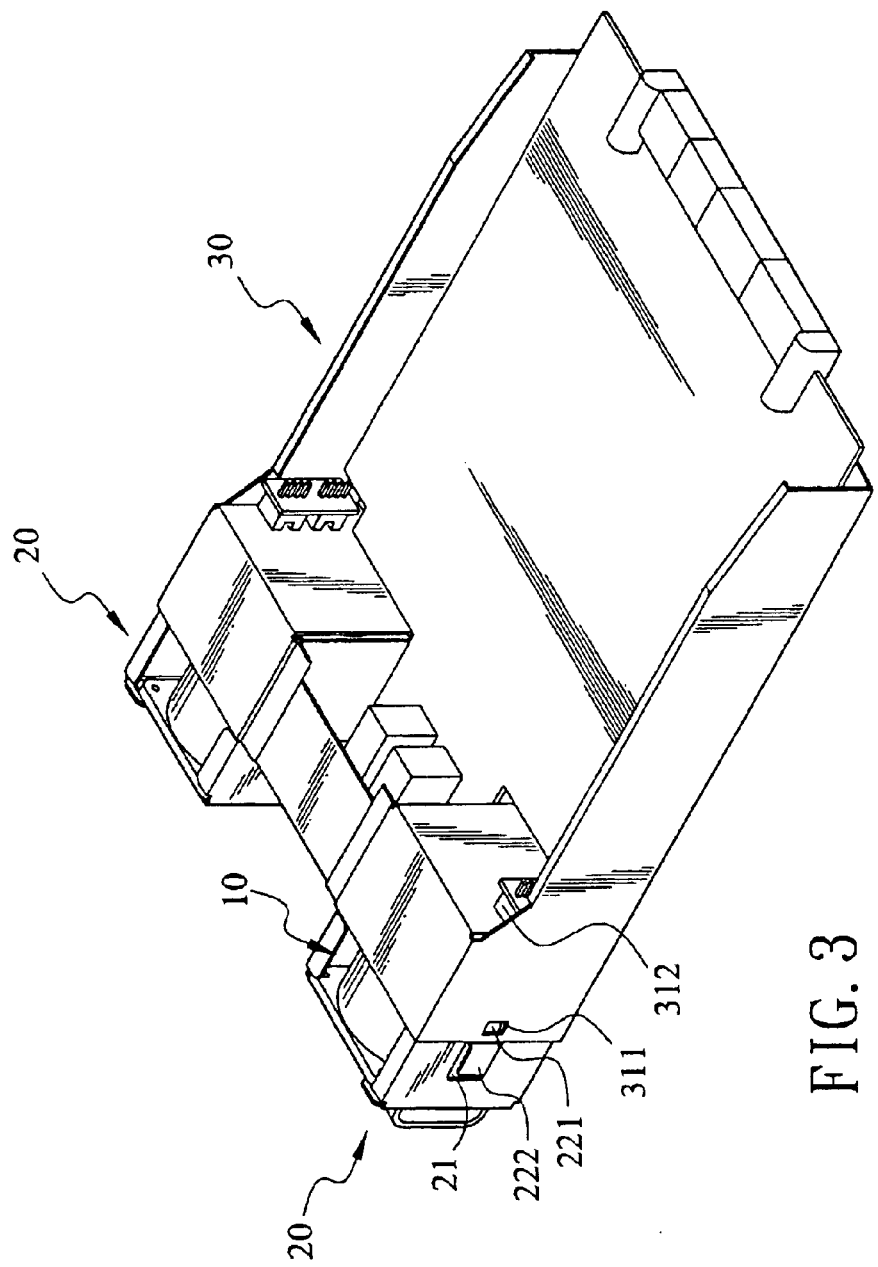
FIG. 3 is a perspective view of the first embodiment of the invention, assembled.

Refer to FIGS. 1, 2 and 3 for a first embodiment of the invention. The server radiator according to the invention includes a radiator fan 10, a frame 20 and a case 30. The radiator fan 10 aims at discharging heat energy from the interior of the server to enable the server to maintain normal operation. The radiator fan 10 also includes a plurality of screw holes 11.

The frame 20 holds the radiator fan 10. It includes a trough 21, a latch element 22, hot-plug leads 23 and apertures 24. The trough 21 holds the latch element 22, which is an elastic slice and has one end fastened to the frame 20 and another end suspended from the surface of the frame 20. The latch element 22 includes a bulged section 221, a driving section 222 and an aperture 223. The driving section 222 and the aperture 223 are located respectively on two distal ends of the latch element 22. The latch element 22 may be fastened to the frame 20 through fastening elements 40. The hot-plug leads 23 are connected to the radiator fan 10 located in the frame 20 for coupling with other elements to establish electric connection. The apertures 24 correspond to the screw holes 11. The fan 10 may be fastened to the frame 20 through the fastening elements 40 passing the screw holes 11 and the trough 21. The handle 25 may receive force to move the frame.

The case 30 has a housing compartment 31 to hold the frame 20. The housing compartment 31 has an opening directed toward and exposed outside of the case 30. It also has an exposed opening 311 corresponding to the bulged section 221. The exposed opening 311 is located on the outer case 30 and corresponds to the latch element 22. The housing compartment 31 further has hot-plug slots 312 corresponding to the hot-plug leads 23 to establish electric connection between the radiator fan 10 located in the frame 20 and other elements.

Thus when the radiator fan 10 is held in the frame 20, it may be fastened by engaging the fastening elements 40 through the screw holes 11 and apertures 24 by means of hand tools. Then the frame 20 may be disposed in the housing compartment 31 from outside the case 30 (as the opening of the housing compartment 31 is directed toward and exposed outside the case 30). The bulged section 221 of the latch element 22 is latched in the exposed opening 311 to anchor the frame 20 in the housing compartment 31. The driving section 222 is exposed outside the housing compartment 31. The hot-plug leads 23 may be inserted into the hot-plug slots 312 to establish electric connection between the radiator fan 10 in the frame 20 and other elements.

In the event that the radiator fan 10 in the frame 20 is damaged, another radiator fan 10 may be housed in another frame 20 as previously discussed. Then the original frame 20 that contains the damaged radiator fan 10 may be removed, and another frame 20 may be inserted in the housing compartment 31 as mentioned above. The frame 20 containing the radiator fan 10 may even be prepared in advance to speed up replacement. As the invention can allow maintenance without opening the case 30, a great deal of replacement time can be saved.

Figure 4:
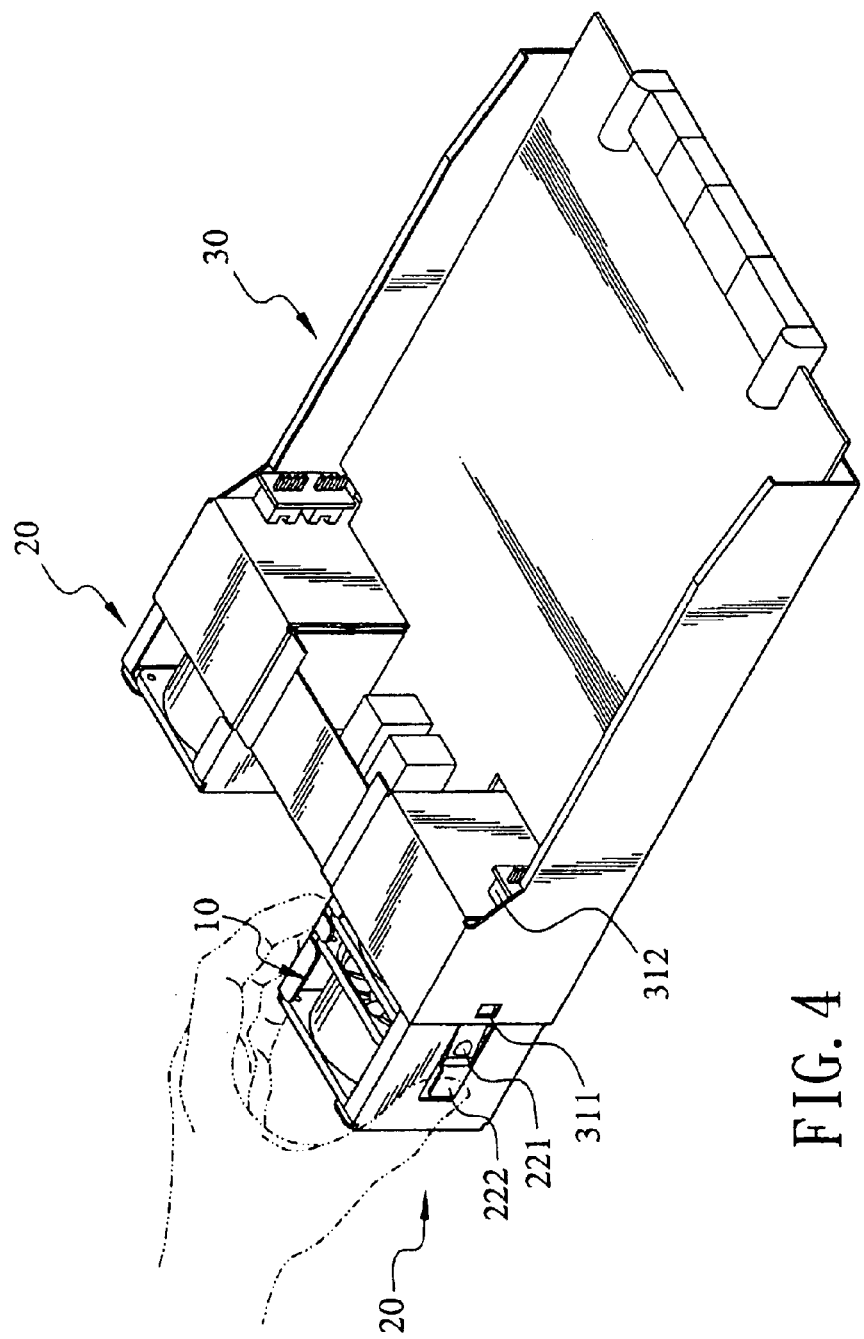
FIG. 4 is a schematic view of the first embodiment of the invention, showing the operation of removing the frame.

To, remove the frame 20 from the housing compartment 31, exert a force on the driving section 222 to move the bulged section 221 away from the exposed opening 311, and the latch element 22 may be moved in the trough 21, thereby removing the frame 20 from the housing compartment 31 (as shown in FIG. 4).

Figure 5:
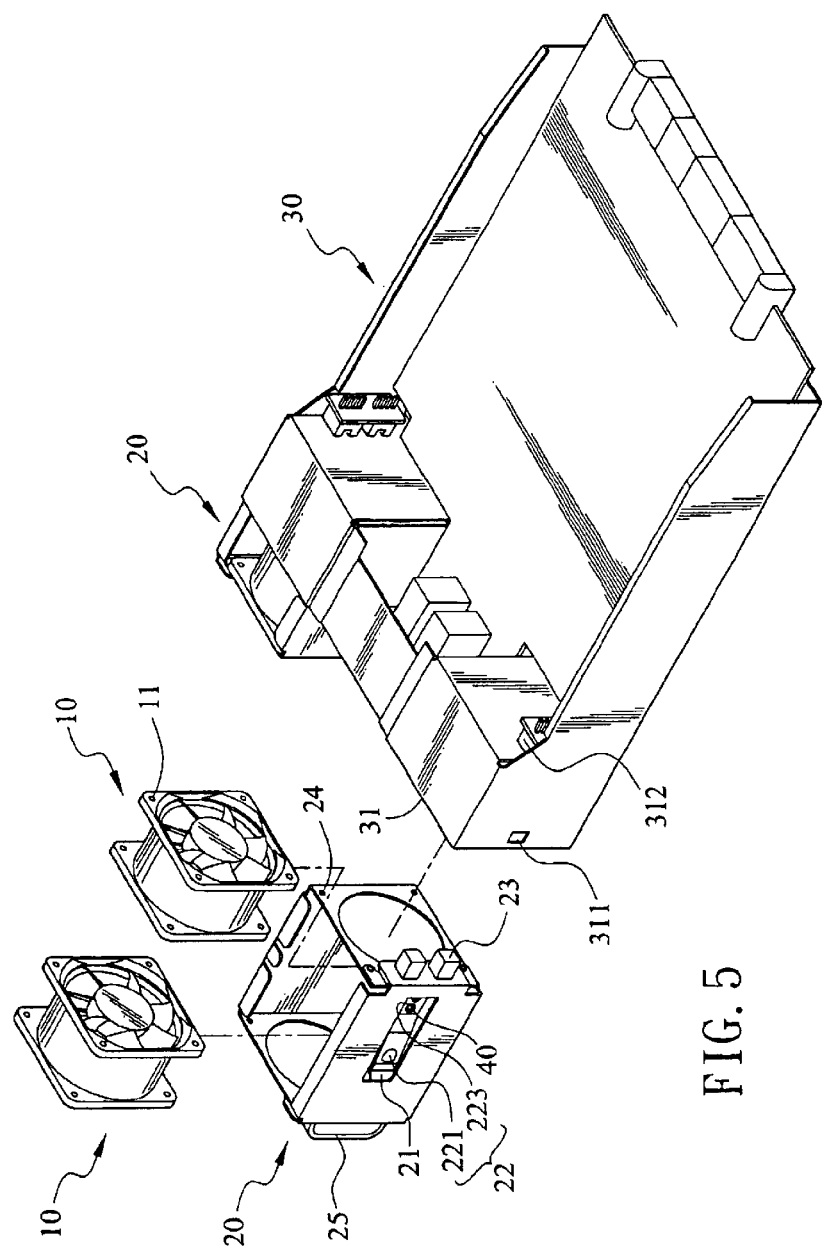
FIG. 5 is a perspective view of a second embodiment of the invention, partly assembled.
Figure 6:
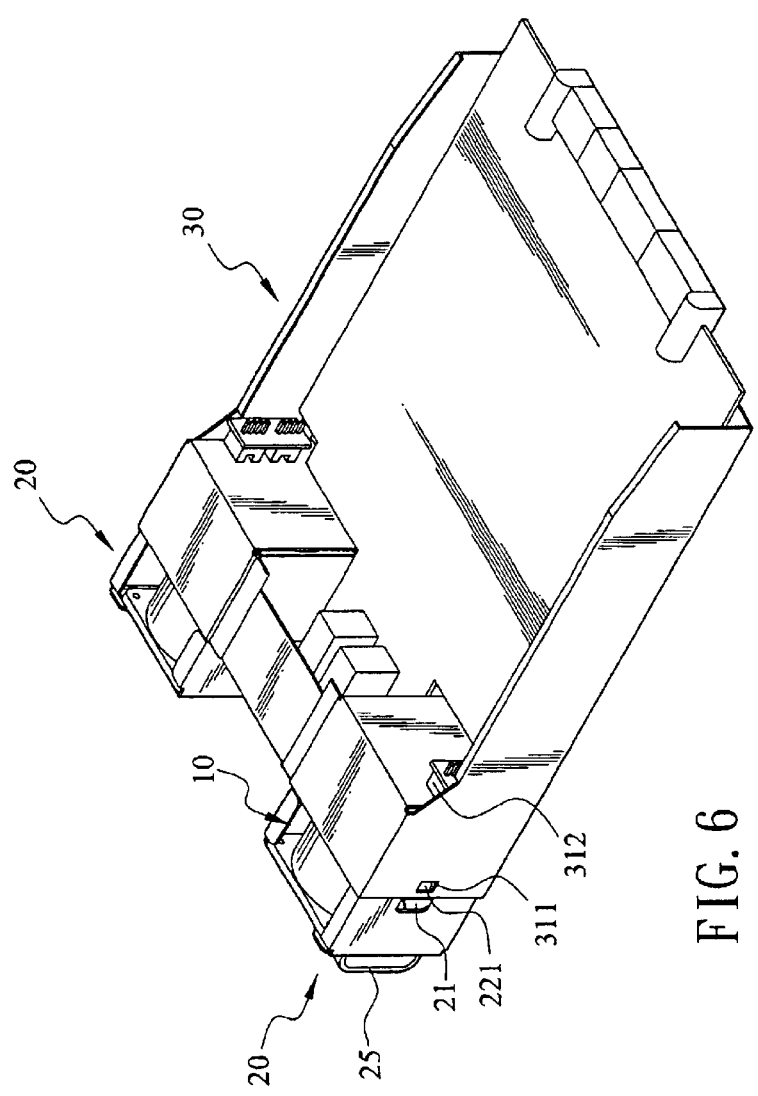
FIG. 6 is a perspective view of the second embodiment of the invention, assembled.

Refer to FIGS. 5 and 6 for a second embodiment of the invention. The server radiator according to this embodiment includes a radiator fan 10, a frame 20 and a case 30. The radiator fan 10 aims at discharging heat energy from the interior of the server to enable the server to maintain normal operation. The radiator fan 10 also includes a plurality of screw holes 11.

The frame 20 holds the radiator fan 10. It includes a trough 21, a latch element 22, hot-plug leads 23, apertures 24 and a handle 25. The trough 21 holds the latch element 22, which is an elastic slice and has one end fastened to the frame 20 and another end suspended from the surface of the frame 20. The latch element 22 includes a bulged section 221 and an aperture 223. The aperture 223 is located on a distal end of the latch element 22. The latch element 22 may be fastened to the trough 21 of the frame 20 through fastening elements 40. The hot-plug leads 23 are connected to the radiator fan 10 located in the frame 20 for coupling with other elements to establish electric connection. The apertures 24 correspond to the screw holes 11. The fan 10 may be fastened to the frame 20 through the fastening elements 40 passing the screw holes 11 and the trough 21. The handle 25 may receive force to move the frame.

The case 30 has a housing compartment 31 to hold the frame 20. The housing compartment 31 has an opening directed toward and exposed outside of the case 30. It also has an exposed opening 311 corresponding to the bulged section 221. The exposed opening 311 is located on the outer side of the case 30 and corresponds to the latch element 22. The housing compartment 31 further has hot-plug slots 312 corresponding to the hot-plug leads 23 to establish electric connection between the radiator fan 10 located in the frame 20 and other elements.

Thus when the radiator fan 10 is held in the frame 20, it may be fastened by engaging the fastening elements 40 through the screw holes 11 and apertures 24 by means of hand tools. Then the frame 20 may be disposed in the housing compartment 31 from outside the case 30 (as the opening of the housing compartment 31 is directed toward and exposed outside the case 30). The bulged section 221 of the latch element 22 is latched in the exposed opening 311 to anchor the frame 20 in the housing compartment 31. The hot-plug leads 23 may be inserted into the hot-plug slots 312 to establish electric connection between the radiator fan 10 in the frame 20 and other elements.

In the event that the radiator fan 10 in the frame 20 is damaged, another radiator fan 10 may be housed in another frame 20 as previously discussed. Then the original frame 20 that contains the damaged radiator fan 10 may be removed, and another frame 20 may be inserted in the housing compartment 31 as mentioned above. The frame 20 containing the radiator fan 10 may even be prepared in advance to speed up replacement. As the invention can provide maintenance without opening the case 30, a great deal of replacement time can be saved.

Figure 7:
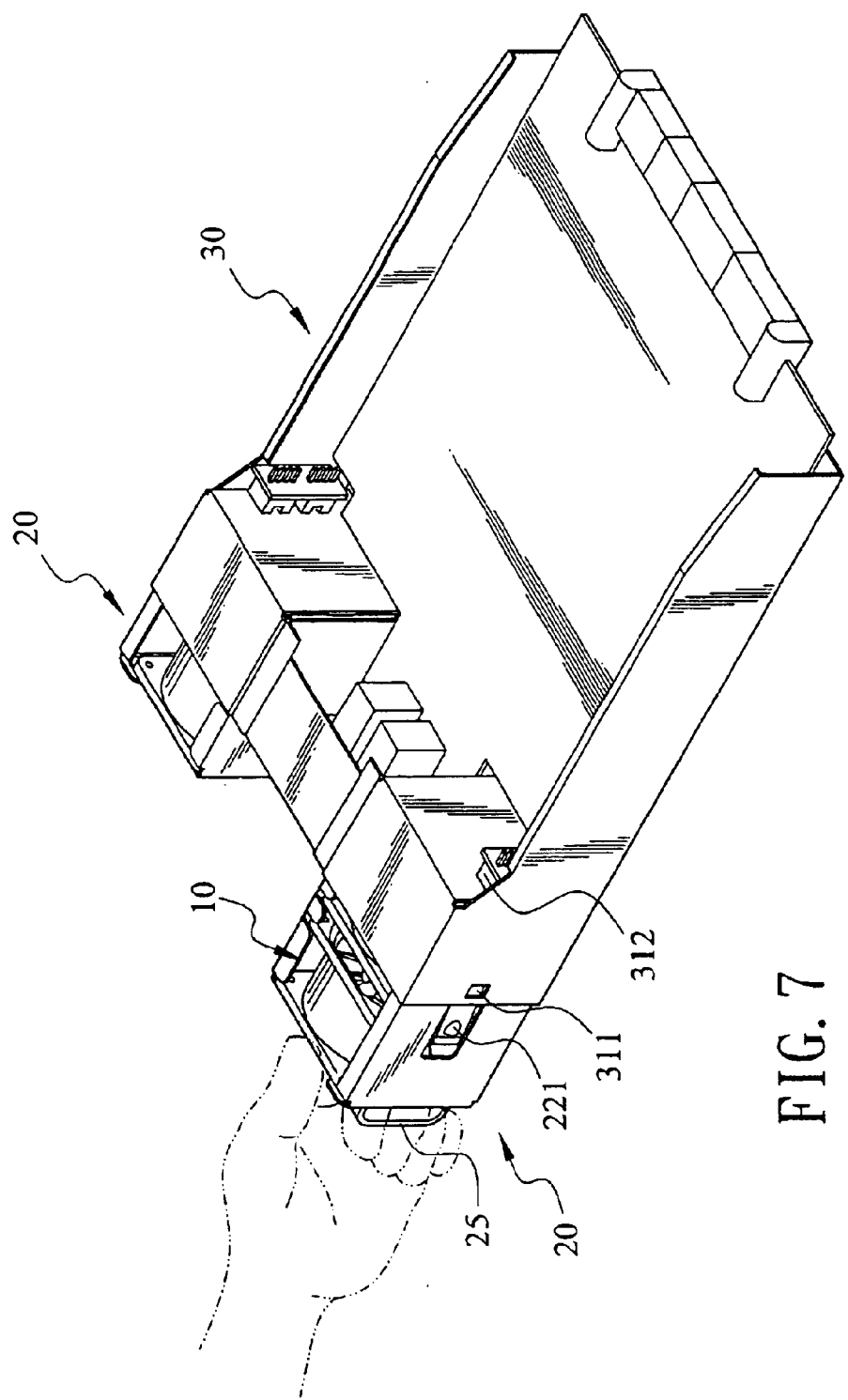
FIG. 7 is a schematic view of the second embodiment of the invention, showing the operation of removing the frame.

To remove the frame 20 from the housing compartment 31, move the bulged section 221 away from the exposed opening 311, and the latch element 22 may be moved in the trough 21. Then pull the handle 25 to remove the frame 20 from the housing compartment 31 (as shown in FIG. 7).

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A server radiator, comprising:

a radiator fan;

a frame for holding the radiator fan having a latch element; and a case having a housing compartment for holding the frame, the housing compartment having an opening directed toward and exposed outside the case, and an exposed opening corresponding to the latch element thereby the frame is insertable into the housing compartment from outside the case to engage the latch element with the exposed opening, and the latch element is movable away from the exposed opening to remove the frame from the housing compartment.

2. The server radiator of claim 1, wherein the latch element is an elastic slice having one end fastened to the frame and another end suspended from the surface of the frame, and including a bulged section located on the latch element and corresponding to the exposed opening and a driving section located on a distal end of the latch element;

wherein the driving section is exposed outside the housing compartment when the frame is held in the housing compartment to receive a force to move the bulged section away from the exposed opening and allow the frame to be removed from the housing compartment.

3. The server radiator of claim 2, wherein the latch element has an aperture on another distal end for receiving a fastening element to fasten the latch element to the frame.

4. The server radiator of claim 1, wherein the latch element is an elastic slice which has one end fastened to the frame and another end suspended from the surface of the frame, and includes a bulged section located on the latch element and corresponding compartment the bulged section is engaged with the exposed opening.

5. The server radiator of claim 4, wherein the latch element has an aperture on one distal end for receiving a fastening element to fasten the latch element to the frame.

6. The server radiator of claim 1, wherein the frame has a handle to receive a force to remove the frame from the housing compartment after the latch element has been moved away from the exposed opening.

7. The server radiator of claim 1, wherein the frame has a trough for housing the latch element.

8. The server radiator of claim 1, wherein the frame has a hot-plug lead, and the housing compartment has a hot-plug slot corresponding to the hot-plug lead.

9. The server radiator of claim 1, wherein the radiator fan has a plurality of screw holes, the frame having apertures corresponding to the screw holes for receiving fastening elements to fasten the radiator fan to the frame.

* * * * *